United States Patent [19]

Hsu

[11] Patent Number: 5,627,106

[45] Date of Patent: May 6, 1997

[54] TRENCH METHOD FOR THREE DIMENSIONAL CHIP CONNECTING DURING IC FABRICATION

[75] Inventor: Chen-Chung Hsu, Taichung, Taiwan

[73] Assignee: United Microelectronics Corporation, Hsin-Chu, Taiwan

[21] Appl. No.: 239,281

[22] Filed: May 6, 1994

[51] Int. Cl.⁶ .................................................. H01L 21/44
[52] U.S. Cl. .......................... 438/459; 438/152; 438/667; 438/107
[58] Field of Search ................................... 437/203, 915, 437/208, 209; 148/DIG. 164

[56] References Cited

U.S. PATENT DOCUMENTS

| | | | |
|---|---|---|---|
| 4,612,083 | 9/1986 | Yasumoto et al. | 156/633 |
| 4,818,728 | 4/1989 | Rai et al. | 437/209 |
| 4,982,266 | 1/1991 | Chatterjee . | |
| 4,998,665 | 3/1991 | Hayashi | 228/180.1 |
| 5,087,585 | 2/1992 | Hayashi | 437/51 |
| 5,220,403 | 6/1993 | Batchelder et al. | 356/345 |
| 5,266,511 | 11/1993 | Takao | 437/51 |
| 5,270,261 | 12/1993 | Bertin et al. | 437/209 |
| 5,419,806 | 5/1995 | Huebner | 156/645 |

Primary Examiner—George Fourson
Assistant Examiner—C. Everhart
Attorney, Agent, or Firm—William H. Wright

[57] ABSTRACT

A new method of connecting three-dimensional integrated circuit chips using trench technology is described. Semiconductor device structures are provided in and on the top side of a semiconductor substrate of a first and a second three-dimensional integrated circuit chip. Deep trenches are etched into the first semiconductor substrate. A conductive material is deposited into the trenches. An insulating material is deposited over the surface of the substrate, polished and planarized. The bottom side of the first semiconductor substrate is ground, polished, and selectively etched so that the deep trenches form protrusions from the bottom surface. A passivation layer and a polyimide layer are deposited on the bottom surface of the first semiconductor substrate and etched away around the protrusions. A passivation layer and a polyimide layer are deposited over the top surface of the second semiconductor substrate. Connection windows are etched through the two layers to the top conducting surface of the second semiconductor substrate. The first and second integrated circuits are aligned so that the protrusions on the bottom surface of the first integrated circuit chip fit into the connection windows in the top surface of the second integrated circuit chip. The polyimide layer on the bottom surface of the first integrated circuit contacts the polyimide layer on the top surface of the second integrated circuit completing the connection between the two chips.

33 Claims, 6 Drawing Sheets

TRENCH METHOD FOR THREE DIMENSIONAL CHIP CONNECTING DURING IC FABRICATION

BACKGROUND OF THE INVENTION

(1) Field of the Invention

The invention relates to a method of connecting three-dimensional integrated circuits chips, and more particularly, to a method of connecting integrated circuit chips using a trench method.

(2) Description of the Prior Art

The density and scale of integration of integrated circuit chips will continue to increase in the future. High density integrated circuits have a limited space available without shrinking transistor device sizes. One of the technologies which provide a means to break through the space limitation is a three-dimensional integrated circuit technology.

Using three-dimensional integrated circuit technology, high density integrated circuits can be produced which consist of one master chip and some subordinate chips. All control circuits can be put in the master chip and other function block circuits can be arranged in subordinate chips with interconnection between the chips. For example, in a Read-Only Memory (ROM) or Static Random Access Memory (SRAM) circuit, the control circuit can be fabricated on the master chip and 8 input/output (I/O) blocks can be formed in each subordinate chip. The chips can be stacked by interconnection through the pad window. The interconnection between chips can be fabricated during integrated circuit processing. Using this method, we can fabricate a high density ROM or SRAM stack memory chip.

U.S. Pat. No. 4,818,728 to Rai et al teaches a chip interconnection method involving metal studs on a surface of one chip and solder deposits on the surface of the second chip. The solder deposits are melted and the chips connected by fixing the metal studs into the melted solder. U.S. Pat. No. 4,998,665 to Hayashi teaches a chip interconnection method in which a high melting point conductive material projection is plunged into a liquid low melting point conductive material and then cooled to complete the connection.

SUMMARY OF THE INVENTION

A principal object of the present invention is to provide an effective and very manufacturable method of connecting three-dimensional integrated circuit chips.

Another object of the invention is to provide an effective and very manufacturable method of connecting three-dimensional integrated circuit chips using a trench method.

In accordance with the objects of this invention, a new method of connecting three-dimensional integrated circuit chips using trench technology is achieved. Semiconductor device structures are provided in and on the top side of a semiconductor substrate of a first and a second three-dimensional integrated circuit chip. The first integrated circuit chip is prepared for connection as follows. Deep trenches are etched into the first semiconductor substrate. An insulating film is deposited over the entire surface of the first semiconductor substrate and within the deep trenches. The insulating film is selectively etched away from the bottom of the trenches. A first conductive material is deposited into the trenches. A second conductive material is deposited over the surface of the oxide film wherein the second conductive material connects to the first conductive material. A passivation layer is formed over the second conductive layer. Contact windows are opened in the passivation layer to the second conductive layer over the deep trenches. The bottom side of the first semiconductor substrate is ground, polished, and selectively etched so that the deep trenches form protrusions from the bottom surface of the first semiconductor substrate. A bottom passivation layer is deposited on the bottom surface of the first semiconductor substrate. The bottom passivation layer is etched away around the protrusions. A polyimide coating is deposited over the surface of the bottom passivation layer and etched away around the protrusions completing preparation of the first integrated circuit for connection. The second integrated circuit chip is prepared for connection as follows. A passivation layer is deposited over the top surface of the second semiconductor substrate. A polyimide coating is applied over the passivation layer. Connection windows are etched through the polyimide and passivation layers to the top conducting surface of the second semiconductor substrate completing preparation of the second integrated circuit for connection. The first and second integrated circuits are aligned so that the protrusions on the bottom surface of the first integrated circuit chip fit into the connection windows in the top surface of the second integrated circuit chip. The polyimide layer on the bottom surface of the first integrated circuit contacts the polyimide layer on the top surface of the second integrated circuit completing the connection between the two three-dimensional integrated circuit chips.

BRIEF DESCRIPTION OF THE DRAWINGS

In the accompanying drawings forming a material part of this description, there is shown.

DESCRIPTION OF THE PREFERRED EMBODIMENTS

Figure 1:
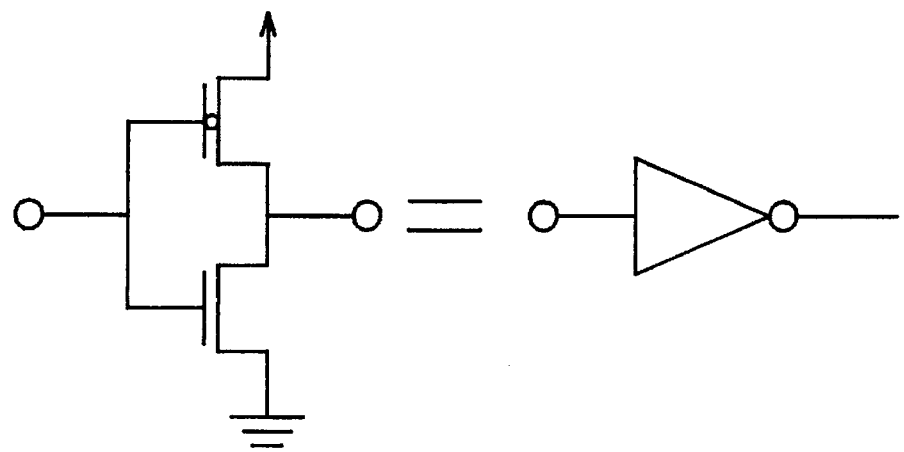
FIG. 1 schematically illustrates a simple inverter circuit.

The logic diagram of a simple CMOS inverter circuit is shown in FIG. 1. Such a circuit will be used as an example to describe the stacking chip fabrication by trench connection method of the invention. For example, the NMOS portion of the circuit may reside in the master chip while the PMOS portion of the circuit resides in the subordinate chip.

Figure 2:
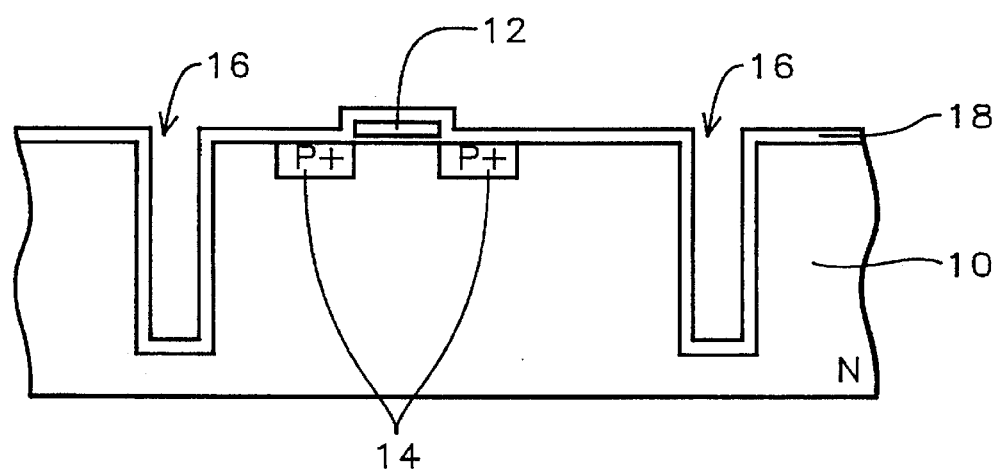
FIGS. 2 through 8 schematically illustrate in cross-sectional representation the preparation of a subordinate chip for connection.

Referring now more particularly to FIG. 2, the process of the present invention will be described. A portion of a partially completed integrated circuit subordinate chip is illustrated in FIG. 2 consisting of a semiconductor substrate 10, preferably composed of monocrystalline silicon. Semiconductor device structures have been formed as is conventional in the art in and on the semiconductor substrate 10. For example, gate electrode 12 and source/drain regions 14 are illustrated in FIG. 2. Now the subordinate chip will be prepared for interconnection with a master chip.

First, deep trenches 16 are etched into the silicon substrate as by reactive ion etching. The trenches are more than about 10 microns in depth and are between about 20 to 50 microns in width. A silicon dioxide film 18 for insulation is formed on the entire surface of the substrate. This film is formed by atmospheric pressure chemical vapor deposition (APCVD) and has a thickness of between about 2500 to 3000 Angstroms.

Figure 3:
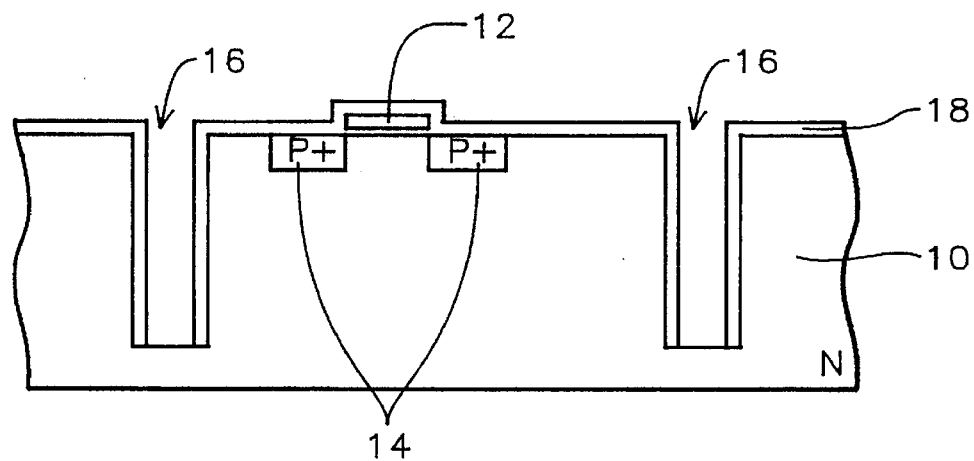

Referring now to FIG. 3, the silicon dioxide film 18 is selectively etched from the bottom of the trenches 16. A mask patterning process is used to accomplish this selective plasma etching.

Figure 4:
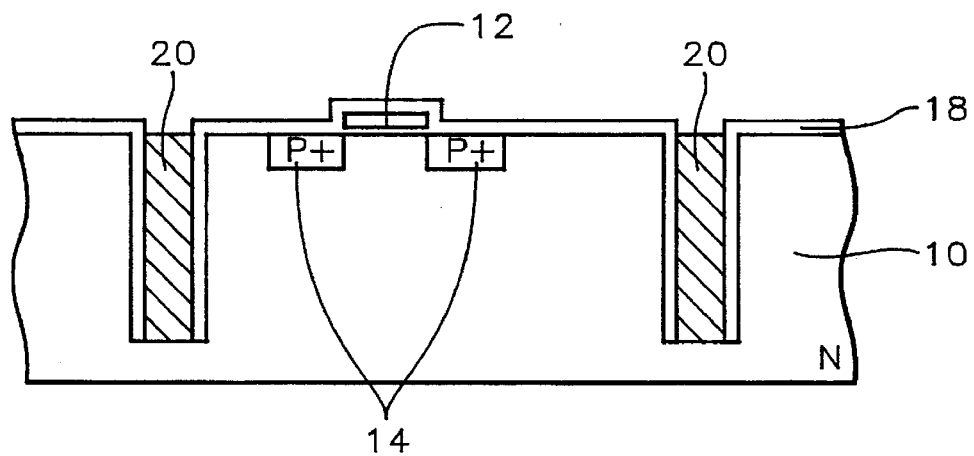

A conductive material layer 20 is deposited by selective tungsten chemical vapor deposition (CVD) techniques, as shown in FIG. 4.

Figure 5:
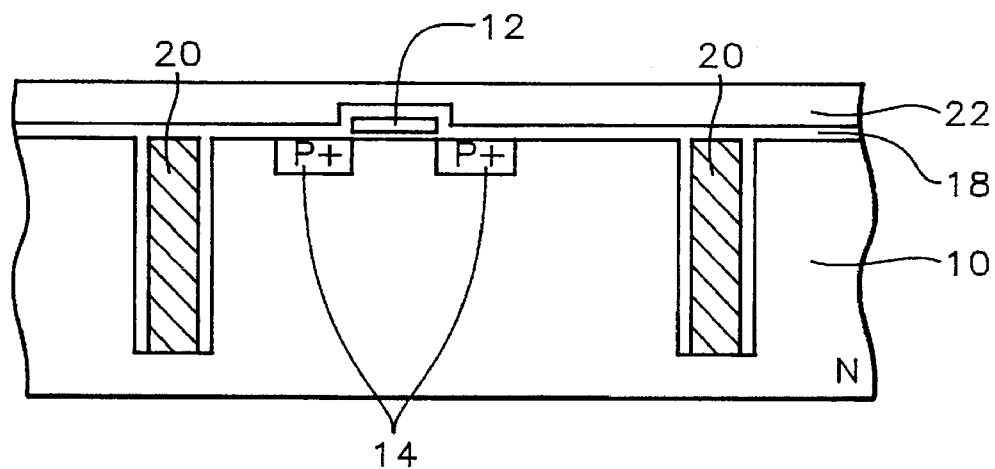

Referring now to FIG. 5, an insulation material 22, such as silicon dioxide, is deposited over the silicon dioxide film 18. This layer is polished by Chemical Mechanical Polishing (CMP) to planarize the layer. The combined thickness of insulation layers 18 and 22 is between about 3000 to 3500 Angstroms.

Figure 6:
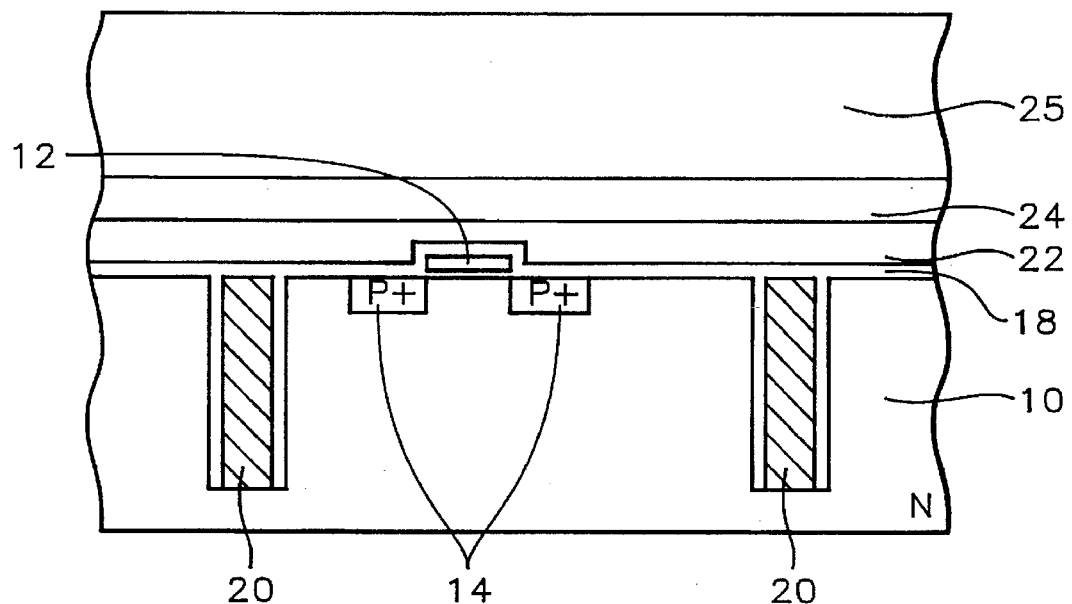

In order to handle a thin wafer more easily, a sacrificial wafer is used. A layer of thermal oxide 24 is grown to a thickness of between about 3000 to 5000 Angstroms on the surface of a monocrystalline silicon wafer 25. Using wafer oxide to oxide bonding technology, the silicon dioxide layer 22 bonds with the thermal oxide layer 24 of the sacrificial wafer, as shown in FIG. 6.

Figure 7:
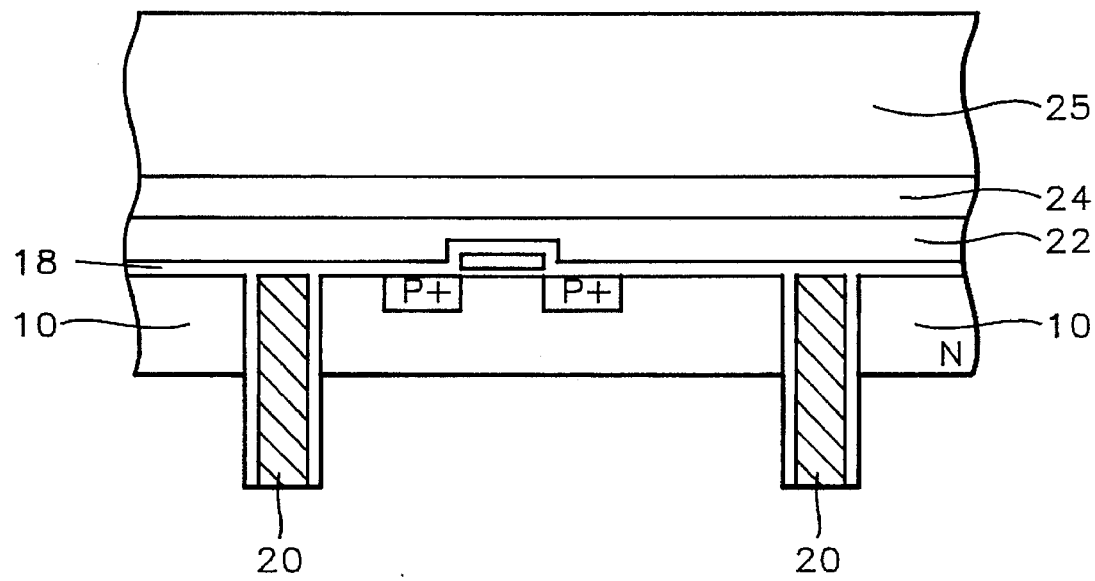

Referring now to FIG. 7, the bottom surface of the substrate is ground and polished so that only a thin portion of the substrate remains over the tungsten-filled trenches 20. Back side selective etching is used to etch away the silicon substrate from the bottom leaving the tungsten-filled trenches protruding about 5 to 6 microns from the bottom surface of the substrate.

Figure 8:
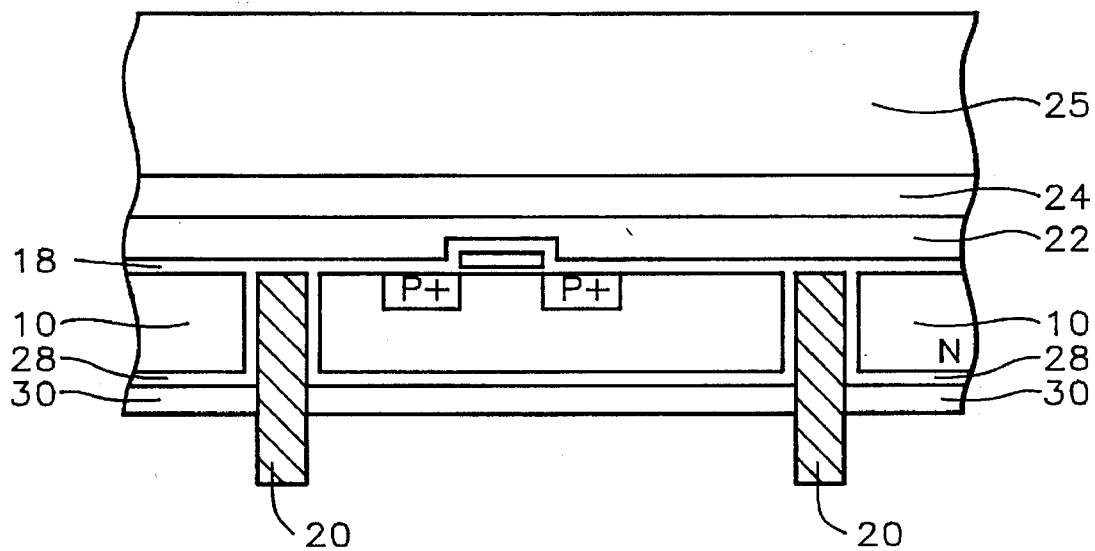

Using plasma enhanced chemical vapor deposition (PECVD), a silicon dioxide passivation layer 28 is deposited on the bottom surface of the substrate, as shown in FIG. 8, using a low temperature of less than about 300° C. to a thickness of between about 8000 to 12,000 Angstroms. Using photoresist and a mask patterning process, the oxide layer 22 is etched away around the protrusions 20, as shown in FIG. 8. A layer of polyimide 30 is coated on the bottom surface of the substrate. Using photoresist and a mask patterning process as above, the polyimide layer 30 is etched away around the tungsten protrusions 20. The subordinate chip has now been prepared for connection.

Figure 9:
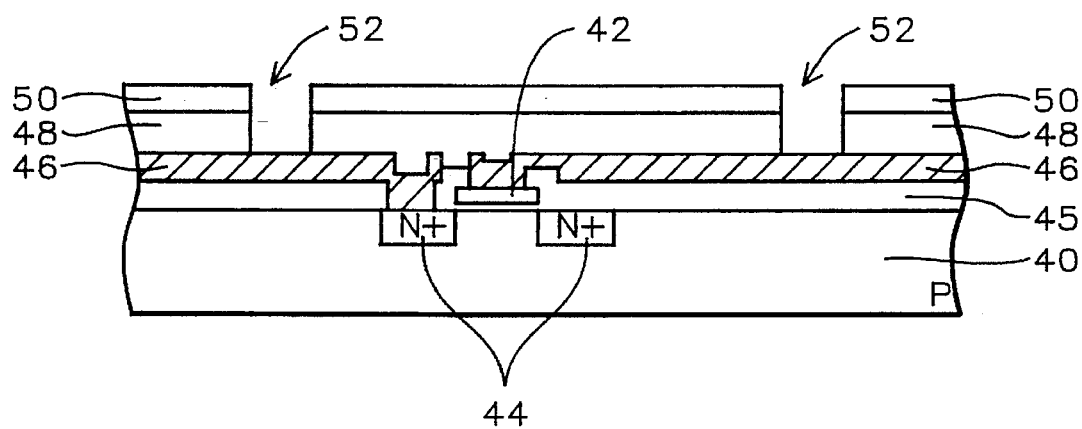
FIG. 9 schematically illustrates in cross-sectional representation the preparation of a master chip for connection.

Referring now to FIG. 9, the master chip is prepared for connection to the subordinate chip. A portion of a partially completed integrated circuit master chip is illustrated in FIG. 9 consisting of a semiconductor substrate 40, preferably composed of monocrystalline silicon. Semiconductor device structures have been formed as is conventional in the art in and on the semiconductor substrate 40. For example, gate electrode 42 and source/drain regions 44 are illustrated in FIG. 9. A conductive layer, such as aluminum, 46 has been deposited and patterned on the top surface of the substrate. Now a passivation layer 48 of silicon dioxide or silicon nitride is deposited by CVD over the top of the patterned conductive layer 46.

A polyimide coating 50 is now applied to the top surface of the substrate. The polyimide and passivation layers 50 and 48, respectively, are etched to provide connection windows 52 contacting conductive layer 46 and in a position corresponding to the protrusions of the subordinate chip. The master chip is now prepared for interconnection to the subordinate chip.

Figure 10:
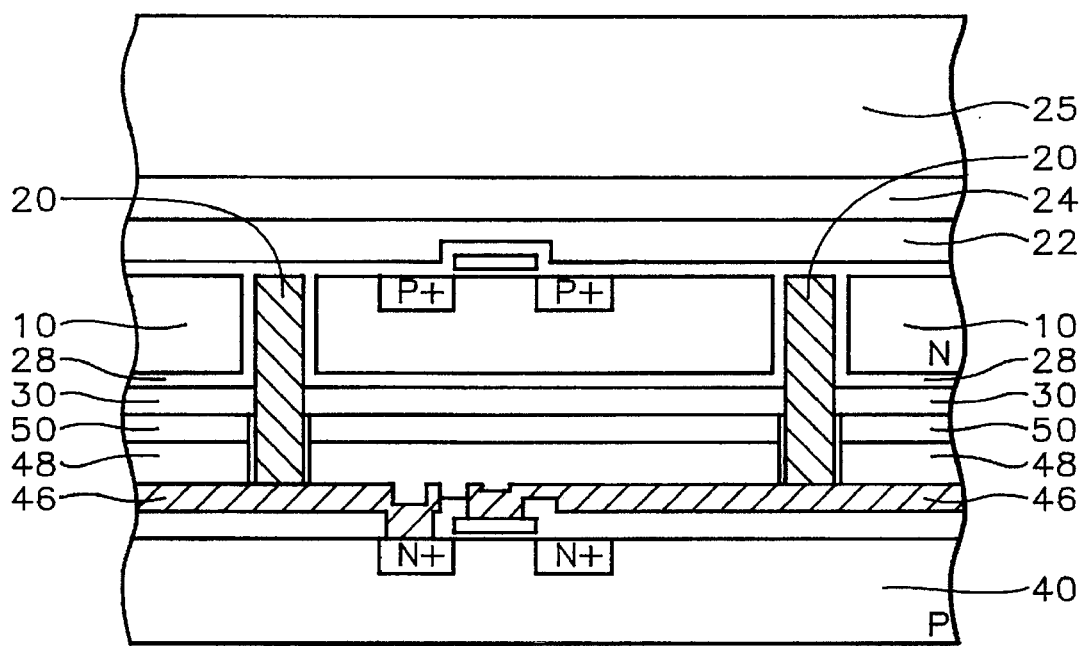
FIGS. 10 through 12 schematically illustrate in cross-sectional representation the connection of a master chip and a subordinate chip.

Using infrared microscopy, the subordinate chip and the master chip are aligned and put together at between about 380° to 420° C., and preferably 400° C. so that the protrusions 20 of the subordinate chip fit into the connection windows 52 of the master chip as shown in FIG. 10. The tungsten protrusions 20 will adhere to the metal layer 48 within the contact windows 52 and the two polyimide layers 30 and 50 will adhere to complete the connection of the two integrated circuit chips.

Figure 11:
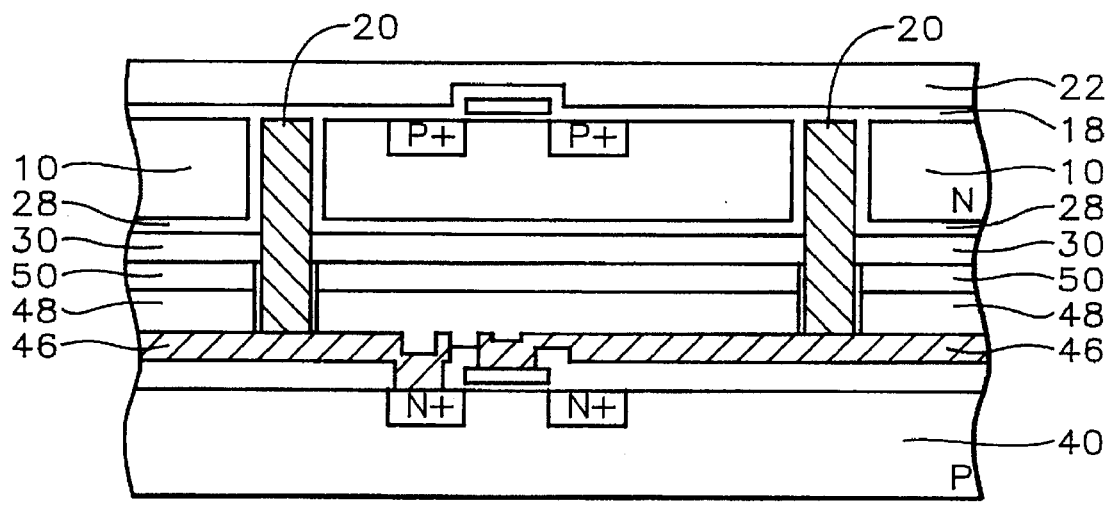

Referring now to FIG. 11, the combination chip is reversed 180°. The sacrificial silicon surface 25 and the thermal oxide 24 are ground and polished using CMP to the edge of the silicon dioxide 22 layer.

Figure 12:
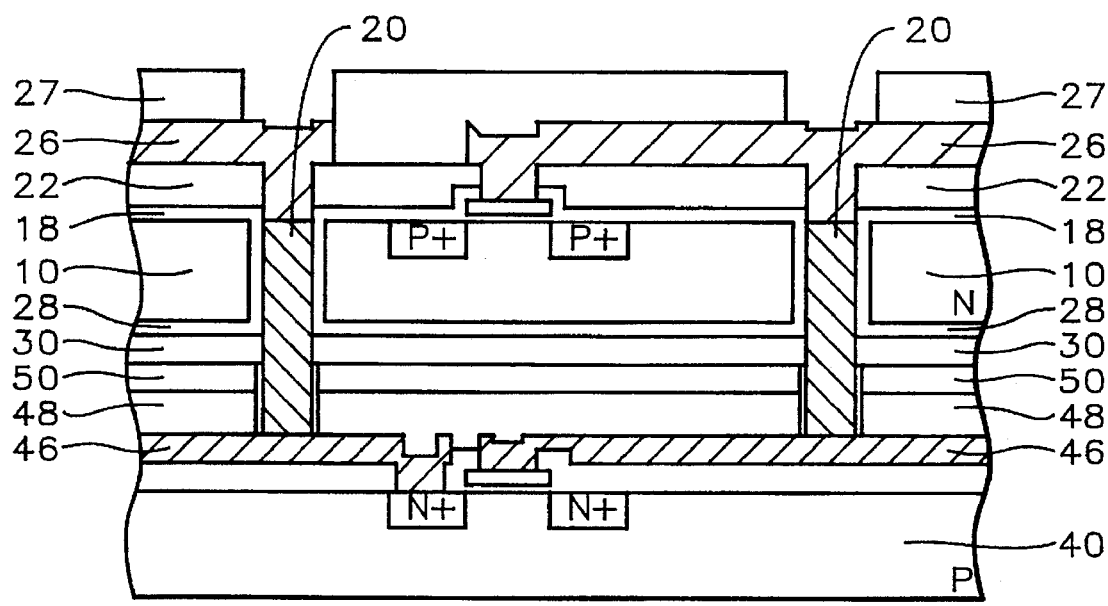

Referring now to FIG. 12, a metal layer 26 is deposited on the surface of the subordinate chip and patterned. A silicon dioxide layer 27 is deposited over the metal layer 26. The top surface of the subordinate chip can now be prepared to be connected to other subordinate chips. This combination chip will now act as the master chip to be connected to another subordinate chip, following the process of the invention described in detail above.

While the invention has been particularly shown and described with reference to the preferred embodiments thereof, it will be understood by those skilled in the art that various changes in form and details may be made without departing from the spirit and scope of the invention.

What is claimed is:

1. The method of connecting two three-dimensional integrated circuit chips comprising:
   providing semiconductor device structures in and on the top side of a semiconductor substrate of a first and a second three-dimensional integrated circuit chip;
   preparing said first integrated circuit chip for connection as follows:
      etching deep trenches into said first semiconductor substrate;
      depositing an insulating film over the entire surface of said first semiconductor substrate and within said deep trenches;
      selectively etching away said insulating film from the bottom of said trenches;
      depositing a conductive material into said trenches;
      depositing an isolation material over the surface of said insulating film and polishing and planarizing said isolation material;
      grinding, polishing, and selectively etching the bottom side of said first semiconductor substrate wherein said deep trenches form protrusions from said bottom surface of said first semiconductor substrate;
      depositing a bottom passivation layer on said bottom surface of said first semiconductor substrate;
      etching away said bottom passivation layer around said protrusions;
      depositing a polyimide coating over the surface of said bottom passivation layer; and
      etching away said polyimide coating around said protrusions completing preparation of said first integrated circuit for connection;
   preparing said second integrated circuit chip for connection as follows:
      depositing a passivation layer over the top surface of said second semiconductor substrate;
      depositing a polyimide coating over said passivation layer; and
      etching through said polyimide and said passivation layers to said top conducting surface of said second semiconductor substrate to provide connection windows for said connection completing preparation of said second integrated circuit for connection;
   aligning said first and second integrated circuits wherein said protrusions on said bottom surface of said first integrated circuit chip fit into said connection windows in said top surface of said second integrated circuit chip and wherein said polyimide layer on said bottom surface of said first integrated circuit contacts said polyimide layer on said top surface of said second integrated circuit; and completing said connection between said two three-dimensional integrated circuit chips.

2. The method of claim 1 wherein said first integrated circuit chip is a subordinate chip and wherein said second integrated circuit chip is a master chip.

3. The method of claim 1 wherein said semiconductor device structures include gate electrodes and source and drain regions.

4. The method of claim 1 wherein said deep trenches extend greater than 10 microns into the surface of said first semiconductor substrate.

5. The method of claim 1 wherein said deep trenches have a width of between about 20 to 50 microns.

6. The method of claim 1 wherein said insulating film is composed of silicon dioxide and is deposited by atmospheric pressure chemical vapor deposition (APCVD) to a thickness of between about 2500 to 3000 Angstroms.

7. The method of claim 1 wherein said conductive material is tungsten.

8. The method of claim 1 wherein said isolation material is silicon dioxide and wherein said isolation material is polished using Chemical Mechanical Polishing.

9. The method of claim 1 wherein after said isolation material has been planarized, a sacrificial semiconductor chip composed of a thermal oxide layer grown on the surface of a silicon substrate is bonded to said first integrated circuit chip wherein said thermal oxide layer of said sacrificial semiconductor chip bonds to said isolation material of said first integrated circuit chip and wherein said sacrificial integrated circuit chip allows for ease of handling of said first integrated circuit chip.

10. The method of claim 9 wherein after said two three-dimensional integrated circuit chips have been connected, said silicon substrate and said thermal oxide layer of said sacrificial semiconductor chip are ground and polished away leaving said isolation material as the top layer of said first integrated circuit chip.

11. The method of claim 1 wherein said protrusions protrude from the bottom side of said first semiconductor substrate by between about 5 to 6 microns.

12. The method of claim 1 wherein said bottom passivation layer is composed of silicon dioxide and is deposited by plasma enhanced chemical vapor deposition (PECVD) to a thickness of between about 8000 to 12,000 Angstroms.

13. The method of claim 1 wherein said polyimide layer is coated to a thickness of between about 15,000 to 20,000 Angstroms.

14. The method of claim 1 wherein said passivation layer deposited on top surface of said second semiconductor substrate is composed of phosphosilicate glass and is deposited to a thickness of between about 8000 to 12,000 Angstroms.

15. The method of claim 1 wherein said passivation layer deposited on top surface of said second semiconductor substrate is composed of silicon nitride and is deposited to a thickness of between about 8000 to 12,000 Angstroms.

16. The method of claim 1 wherein said polyimide layer is deposited on said top surface of said second semiconductor substrate to a thickness of between about 15,000 to 20,000 Angstroms.

17. The method of claim 1 wherein said first and second integrated circuits are aligned using infrared microscopy.

18. The method of claim 1 wherein said first and second integrated circuits are connected by thermal compression of about 190 kg/cm2 and heating said integrated circuits to 400° C.

19. The method of claim 1 wherein after said first and second integrated circuit chips have been connected, a metal layer is deposited over the surface of said first integrated circuit chip and wherein said connected integrated circuit chip can be prepared to be connected to a third integrated circuit chip wherein said connected integrated circuit chip will be prepared for connection as was said second integrated circuit chip described hereabove.

20. The method of claim 19 wherein said metal layer is composed of aluminum deposited to a thickness of between about 8000 to 10,000 Angstroms.

21. The method of connecting two-three dimensional integrated circuit chips comprising:

providing semiconductor device structures in and on the top side of a semiconductor substrate of a first and a second three-dimensional integrated circuit chip wherein said semiconductor device structures include gate electrodes and source and drain regions;

forming protrusions of a conductive material protruding from the bottom surface of said first integrated circuit chip wherein said bottom surface between said protrusions is covered with a passivation layer covered with polyimide coating, said protrusion formed by:

etching deep trenches into said first semiconductor substrate, depositing an insulating film over the entire surface of said first semiconductor substrate and within said deep trenches, selectively etching away said insulating film from the bottom of said trenches, depositing a conductive material into said trenches, depositing an isolation material over the surface of said insulating film and planarizing said isolation material, and removing a portion of said first semiconductor substrate so that said deep trenches form said protrusions;

covering the top conductive surface of said second integrated circuit chip with a polyimide layer wherein said polyimide layer is deposited over a passivation layer;

opening connection windows through said polyimide and said passivation layers to said top conductive surface of said second integrated circuit chip wherein said connection windows of said second integrated circuit chip correspond to said protrusions on said first integrated circuit chip; and aligning said first and second integrated circuit chips wherein said protrusions on said bottom surface of said first integrated circuit chip fit into said connection windows and contact said conductive surface of said second integrated circuit chip and wherein said polyimide layer on said bottom surface of said first integrated circuit contacts said polyimide layer on said top surface of said second integrated circuit.

22. The method of claim 21 wherein said first integrated circuit chip is a subordinate chip and wherein said second integrated circuit chip is a master chip.

23. The method of claim 21 wherein said deep trenches extend greater than 10 microns into the surface of said first semiconductor substrate.

24. The method of claim 21 wherein said deep trenches have a width of between about 20 to 50 Angstroms.

25. The method of claim 21 wherein said insulating film is composed of silicon dioxide and is deposited to a thickness of between about 2500 to 3000 Angstroms.

26. The method of claim 21 wherein said conductive material is tungsten.

27. The method of claim 21 wherein said isolation material is silicon dioxide and wherein said isolation material is polished using Chemical Mechanical Polishing.

28. The method of claim 21 wherein said protrusions protrude from the bottom side of said first semiconductor substrate by between about 5 to 6 microns.

29. The method of claim 21 wherein said polyimide layer on said bottom surface of said first integrated circuit is coated to a thickness of between about 8000 to 12,000 Angstroms.

30. The method of claim 21 wherein said polyimide layer deposited on top surface of said second integrated is coated to a thickness of between about 8000 to 12,000 Angstroms.

31. The method of claim 21 wherein said first and second integrated circuits are aligned using infrared microscopy.

32. The method of claim 21 wherein said first and second integrated circuits are connected by thermal compression of about 190 kg/cm2 and heating said integrated circuits to 400° C.

33. The method of connecting two three-dimensional integrated circuit chips comprising:

provifing semiconductor device structures in and on the top side of a semiconductor substrate of a first and a second three-dimensional integrated circuit chip wherein said semiconductor device structures include gate electrodes and source and drain regions;

forming protrusions of a conductive material protruding from the bottom surface of said first integrated circuit chip comprising the steps of:

etching deep trenches into said first semiconductor substrate;

depositing an insulating film over the entire surface of said first semiconductor substrate and within said deep trenches;

selectively etching away said insulating film from the bottom of said trenches;

depositing a conductive material into said trenches;

depositing an isolation material over the surface of said insulating film and polishing and planarizing said isolation material; and grinding, polishing, and selectively etching the bottom side of said first semiconductor substrate wherein said deep trenches form said protrusions from said bottom surface of said first semiconductor substrate;

covering said bottom surface between said protrusions with a passivation layer covered with a polyimide coating;

covering the top conductive surface of said second integrated circuit chip with a polyimide layer wherein said polyimide layer is deposited over a passivation layer;

opening connection windows through said polyimide and said passivation layers to said top conductive surface of said second integrated circuit chip wherein said connection windows of said second integrated circuit chip correspond to said protrusions on said first integrated circuit chip;

aligning said first and second integrated circuit chips wherein said protrusions on said bottom surface of said first integrated circuit chip fit into said connection windows and contact said conductive surface of said second integrated circuit chip and wherein said polyimide layer on said bottom surface of said first integrated circuit contacts said polyimide layer on said top surface of said second integrated circuit; and completing said connection between said two three-dimensional integrated circuit chips by thermal compression of about 190 kg/cm$^2$ and heating said integrated circuit chips to 400° C.

* * * * *